United States Patent
Musa et al.

(10) Patent No.: US 8,203,692 B2
(45) Date of Patent: Jun. 19, 2012

(54) SUB-SEGMENTED ALIGNMENT MARK ARRANGEMENT

(75) Inventors: Sami Musa, Veldhoven (NL); Richard Johannes Franciscus Van Haren, Waalre (NL); Sanjaysingh Lalbahadoersing, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 444 days.

(21) Appl. No.: 12/482,770

(22) Filed: Jun. 11, 2009

(65) Prior Publication Data

US 2009/0310113 A1     Dec. 17, 2009

Related U.S. Application Data

(60) Provisional application No. 61/129,207, filed on Jun. 11, 2008.

(51) Int. Cl.
    *G03B 27/68*     (2006.01)
    *G03B 27/42*     (2006.01)

(52) U.S. Cl. ........................................... 355/52; 355/53

(58) Field of Classification Search .................... 355/52, 355/53, 55, 67; 430/22, 311; 356/399–401; 257/757, 797
See application file for complete search history.

(56) References Cited

U.S. PATENT DOCUMENTS

| | | | |
|---|---|---|---|
| 6,356,343 B1 * | 3/2002 | Shiraishi et al. | 355/77 |
| 7,180,189 B2 * | 2/2007 | Bowes | 257/757 |
| 7,264,907 B2 * | 9/2007 | Watanabe | 430/5 |
| 7,633,618 B2 * | 12/2009 | Monshouwer | 356/401 |

\* cited by examiner

*Primary Examiner* — Hung Henry Nguyen
(74) *Attorney, Agent, or Firm* — Pillsbury Winthrop Shaw Pittman LLP

(57) ABSTRACT

An alignment mark on a substrate includes a periodic structure of a plurality of first elements and a plurality of second elements. The elements are arranged in an alternating repetitive sequence in a first direction. An overall pitch of the periodic structure is equal to a sum of a width of the first element and a width of the second element in the first direction. Each first element has a first periodic sub-structure with a first sub-pitch and each second element has a second periodic sub-structure with second sub-pitch. An optical property of the first element for interaction with a beam of radiation having a wavelength $\lambda$ is different from the optical property of the second element. The overall pitch is larger than the wavelength $\lambda$, and each of the first and the second sub-pitch is smaller than the wavelength.

16 Claims, 4 Drawing Sheets

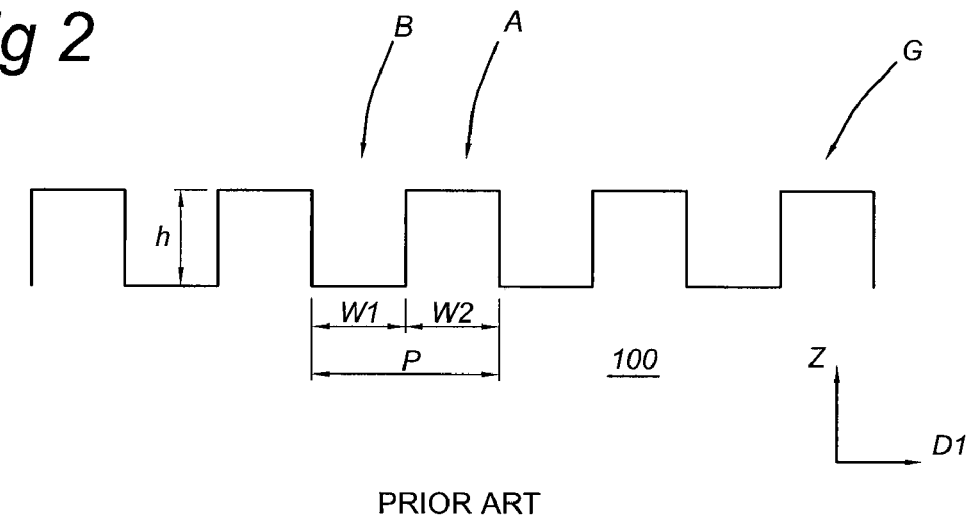
PRIOR ART
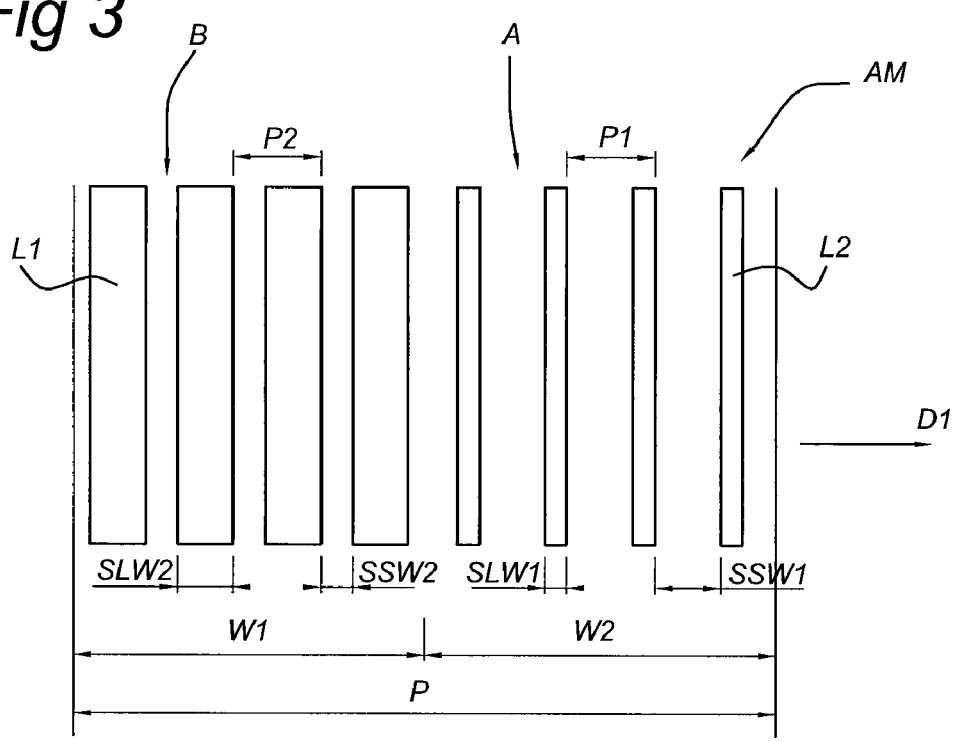

SUB-SEGMENTED ALIGNMENT MARK ARRANGEMENT

CROSS REFERENCE TO RELATED APPLICATIONS

This application claims priority and benefit under 35 U.S.C. §119(e) to U.S. Provisional Patent Application No. 61/129,207, entitled "Sub-Segmented Alignment Mark Arrangement", filed on Jun. 11, 2008. The content of that application is incorporated herein in its entirety by reference.

FIELD

The present invention relates to an alignment mark, an alignment mark arrangement, a lithographic apparatus and use of such an alignment mark.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Typically, a pattern that is to be imaged on a layer of the substrate should be aligned with one or more patterns that have been imaged in a respective preceding patterning step. To this end, optical alignment methods are known that employ alignment marks on the substrate to obtain position and orientation references.

Alignment marks consist of gratings that have periodicity larger than the wavelength of an alignment illumination beam. During an alignment procedure the alignment illumination beam impinges on the grating, and from the diffracted light as generated by the grating an alignment sensor can obtain the information on the position and orientation of the substrate.

For proper processing the constituent parts of the alignment mark that typically consist of the same material as (parts of) device features, should generally have dimensions similar to dimensions of the device features that are manufactured by the lithographical processing to avoid size-induced deviations during processing of integrated circuits, due to, for example, a micro-loading effect during a reactive ion etching process which may occur at device structures in the vicinity of a large marker area or due to size dependency of chemical-mechanical polishing (CMP) of structures. To comply with processing conditions and state-of-the-art design rules sub-segmented marks are being used. The sub-segmented marks that are being used are marks that consist of perpendicular sub-alignment wavelength lines, e.g., the polar mark, and marks that comprise contact holes.

In double patterning technology (DPT) extreme dipolar illumination settings may be used. It is observed that due to the illumination conditions, alignment marks, and more in particular polar marks and marks that consist of contact holes, may not be imaged properly. This results in poorly defined alignment marks or even in a failure to create alignment marks. Use of poorly defined marks in optical alignment may lead to loss of signal. If the poor printability results in an alignment mark with an unintentional asymmetry, such an alignment mark may cause an alignment position shift.

SUMMARY

It is desirable to have a structure of an alignment mark that has improved compatibility with extreme dipolar illumination settings and also with less extreme settings as may be used during other patterning steps during lithographic processing.

According to an aspect of the invention, there is provided an alignment mark on a substrate, comprising a periodic structure of a first plurality of first elements and a second plurality of second elements, the first elements and the second elements being arranged in an alternating repetitive sequence in a first direction, an overall pitch of the periodic structure being equal to a sum of a width of the first element and a width of the second element in the first direction; each first element comprising a first periodic sub-structure having a first sub-pitch; each second element comprising a second periodic sub-structure having a second sub-pitch; an optical property of the first element for interaction with a beam of radiation, being different from said optical property of the second element, the beam of radiation having a wavelength; the overall pitch being larger than the wavelength, and each of the first sub-pitch and the second sub-pitch being smaller than the wavelength.

According to an aspect of the invention, there is provided an alignment mark as described above, wherein the first periodic sub-structure comprises a plurality of first sub-lines and a plurality of first sub-spaces, the first sub-lines and first sub-spaces being arranged in an alternating repetitive sequence in a first sub-pitch direction, the first sub-pitch of the first periodic sub-structure being equal to a sum of a width of the first sub-line and a width of the first sub-space in the first sub-pitch direction, the first sub-lines extending along the surface of the substrate in a direction substantially perpendicular to the first sub-pitch direction.

According to an aspect of the invention, there is provided an alignment mark as described above, wherein the second sub-structure comprises a plurality of second sub-lines and a plurality of second sub-spaces, the second sub-lines and second sub-spaces being arranged in an alternating repetitive sequence in a second sub-pitch direction, the second sub-pitch of the second periodic sub-structure being equal to a sum of a width of the second sub-line and a width of the second sub-space in the second sub-pitch direction, the second sub-lines extending along the surface of the substrate in a direction substantially perpendicular to the second sub-pitch direction.

According to an aspect of the invention, there is provided an alignment mark as described above, wherein the first sub-pitch direction is parallel to the first direction.

According to an aspect of the invention, there is provided an alignment mark as described above, wherein the second sub-pitch direction is parallel to the first direction.

According to an aspect of the invention, there is provided an alignment mark as described above, wherein the first sub-pitch direction is parallel to the second direction.

According to an aspect of the invention, there is provided an alignment mark as described above, wherein the second sub-pitch direction is parallel to the second direction.

According to an aspect of the invention, there is provided an alignment mark as described above, wherein a duty cycle of the first periodic sub-structure, being the ratio of the width of the first sub-line and the width of the first sub-space, is selected to generate an effective refractive index of the first element and to fulfill a saturation mode condition for the wavelength of the beam of radiation, the first sub-pitch being smaller than the ratio of the wavelength and the maximum of the refractive index of each of the materials constituting the mark.

According to an aspect of the invention, there is provided an alignment mark as described above, wherein a duty cycle of the first periodic sub-structure, being the ratio of the width of the first sub-line and the width of the first sub-space, is selected to generate an effective refractive index (nr) of the first element and to fulfill a resonance mode condition for the wavelength of the beam of radiation, the first sub-pitch being larger than the ratio of the wavelength and the maximum of the refractive index of each of the materials constituting the grating and being smaller than the wavelength.

According to an aspect of the invention, there is provided an alignment mark as described above, wherein a duty cycle of the second periodic sub-structure, being the ratio of the width of the second sub-line and the width of the second sub-space, is selected to generate an effective refractive index (nr) of the second element and to fulfill a saturation mode condition for the wavelength of the beam of radiation, the second sub-pitch being smaller than the ratio of the wavelength and the maximum of the refractive index of each of the materials constituting the mark.

According to an aspect of the invention, there is provided an alignment mark as described above, wherein a duty cycle of the second periodic sub-structure, being the ratio of the width of the second sub-line and the width of the second sub-space, is selected to generate an effective refractive index of the second element and to fulfill a resonance mode condition for the wavelength of the beam of radiation, the second sub-pitch being larger than the ratio of the wavelength and the maximum of the refractive index of each of the materials constituting the mark and being smaller than the wavelength.

According to an aspect of the invention, there is provided an alignment mark as described above, wherein the materials constituting the mark comprise a first material with a first optical property value of an optical property and a second material with a second optical property value of said optical property, the first optical property value being different from the second optical property value.

According to an aspect of the invention, there is provided an arrangement of a first alignment mark and a second alignment mark, the first alignment mark comprising: a first periodic structure of a first plurality of first elements and a second plurality of second elements, the first elements and the second elements being arranged in an alternating repetitive sequence in a first direction, an overall pitch of the periodic structure being equal to a sum of a width of the first element and a width of the second element in the first direction; each first element of the first alignment mark comprising a first periodic sub-structure having a first sub-pitch, each second element of the first alignment mark comprising a second periodic sub-structure having a second sub-pitch; the second alignment mark comprising: a second periodic structure of the first plurality of first elements and the second plurality of second elements, the first elements and the second elements being arranged in an alternating repetitive sequence in a second direction perpendicular to the first direction, an overall pitch of the second periodic structure of the second alignment mark being equal to the overall pitch of the first periodic structure of the first alignment mark; each first element of the second alignment mark comprising a first periodic sub-structure having a first sub-pitch, each second element of the second alignment mark comprising a second periodic sub-structure having a second sub-pitch; an optical property of the first element for interaction with a beam of radiation, being different from said optical property of the second element, the beam of radiation having a wavelength; the first sub-pitch and the second sub-pitch of the first alignment mark being directed in the first direction, the first sub-pitch and the second sub-pitch of the second alignment mark being directed in the first direction; the overall pitch being larger than the wavelength, and each of the first sub-pitch and the second sub-pitch of the first alignment mark and of the second alignment mark being smaller than the wavelength.

According to an aspect of the invention, there is provided a lithographic apparatus comprising: an illumination system configured to condition at least one radiation beam; a support constructed to support a patterning device, the patterning device being capable of imparting the at least one radiation beam with a pattern in its cross-section to form at least one patterned radiation beam; a substrate table constructed to hold a substrate; and a projection system configured to project the at least one patterned radiation beam onto a target portion of the substrate, wherein the substrate comprises an alignment mark having a periodic structure of a first plurality of first elements and a second plurality of second elements, the first elements and the second elements being arranged in an alternating repetitive sequence in a first direction, an overall pitch of the periodic structure being equal to a sum of a width of the first element and a width of the second element in the first direction; each first element comprising a first periodic sub-structure having a first sub-pitch; each second element comprising a second periodic sub-structure having a second sub-pitch; an optical property of the first element for interaction with a beam of radiation, being different from said optical property of the second element, the beam of radiation having a wavelength; the overall pitch being larger than the wavelength, and each of the first sub-pitch and the second sub-pitch being smaller than the wavelength.

According to an aspect of the invention, there is provided a lithographic apparatus as described above, wherein the illumination system is configured with an extreme dipolar illumination setting, arranged to condition two radiation beams to converge on the patterning device, the first sub-pitch of the first element and the second sub-pitch of the second element being directed in a direction perpendicular to a plane of incidence comprising the two radiation beams of the dipolar illumination.

According to an aspect of the invention, there is provided a lithographic apparatus as described above, wherein the first sub-pitch of the first element is chosen to be in the resonance regime, and a duty cycle of the first element is chosen such that, during illumination by an alignment beam, effective refractive indices of the two grating modes of the first element excited by the alignment beam have constructive interference at a bottom of the alignment mark and create maximum coupling of the light diffracted by the first element to a diffracted beam of zero transmission diffraction order, and the second sub-pitch of the second element is chosen to be in the resonance regime, and a duty cycle of the second element is chosen such that, during illumination by the alignment beam, effective refractive indices of the two grating modes of the second element excited by the alignment beam have destructive interference at the bottom of the alignment mark and create maximum coupling of the light diffracted by the second element to a diffracted beam of zero reflected diffraction order.

According to an aspect of the invention, there is provided a use in a lithographic apparatus of an alignment mark on a substrate, comprising a periodic structure of a first plurality of first elements and a second plurality of second elements, the first elements and the second elements being arranged in an alternating repetitive sequence in a first direction, an overall pitch of the periodic structure being equal to a sum of a width of the first element and a width of the second element in the first direction; each first element comprising a first periodic sub-structure having a first sub-pitch; each second element comprising a second periodic sub-structure having a second sub-pitch; an optical property of the first element for interaction with a beam of radiation, being different from said optical property of the second element, the beam of radiation having a wavelength; the overall pitch being larger than the wavelength, and each of the first sub-pitch and the second sub-pitch being smaller than the wavelength.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2 depicts an alignment mark from the prior art;

FIG. 3 depicts a portion of a sub-segmented alignment mark in accordance with an embodiment of the present invention;

DETAILED DESCRIPTION

Figure 1:
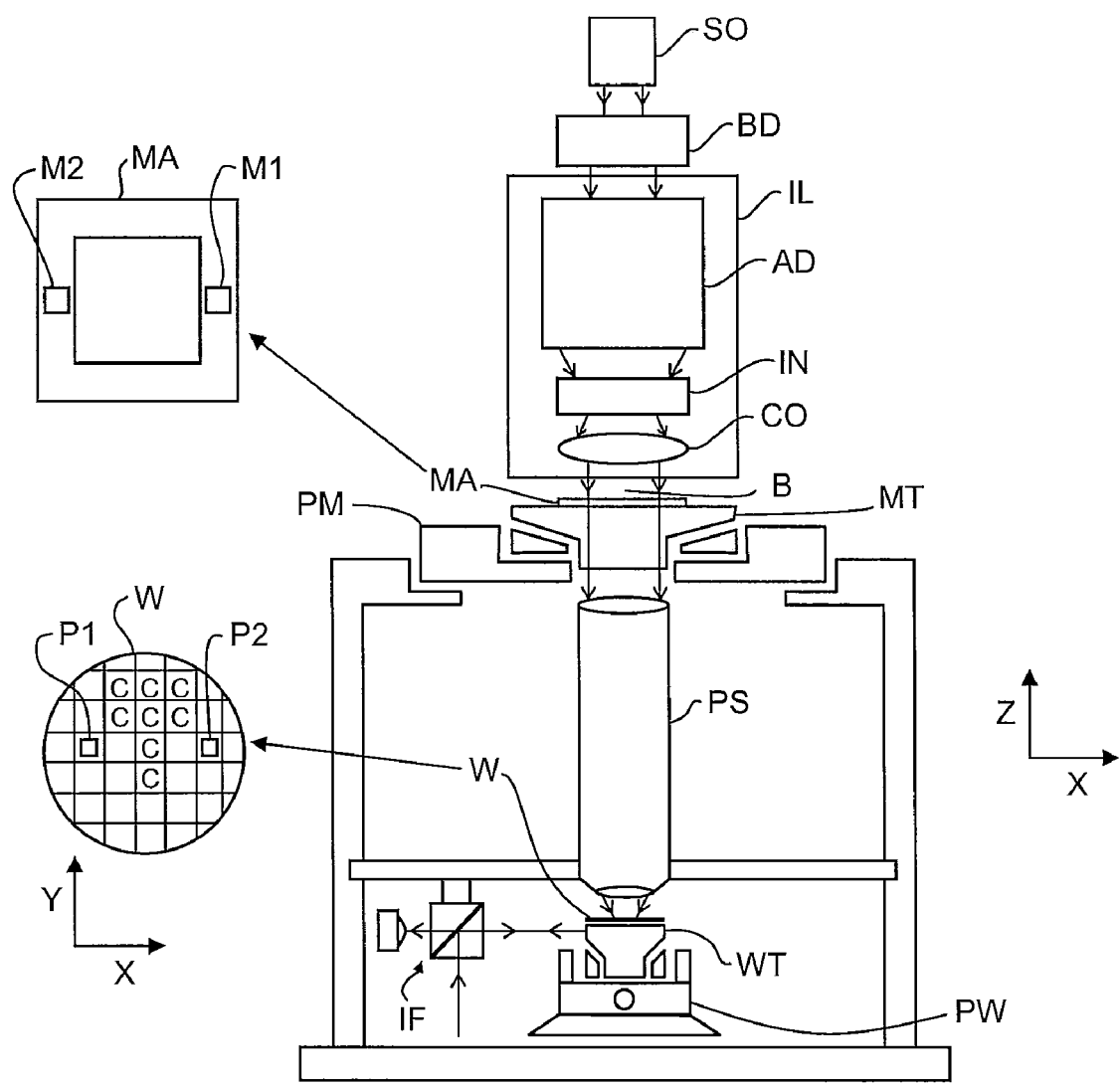
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

FIG. 2 depicts a cross-section of an alignment mark from the prior art. On a substrate 100, a grating G is arranged which comprises a series of parallel lines B and a series of trenches, that are arranged in an alternating repetitive sequence in the horizontal direction D1. The depth of the trenches h is taken along a vertical direction Z.

The lines B and trenches extend, parallel to each other, along a direction (denoted D2) orthogonal to the horizontal direction D1 and the vertical direction Z.

The prior art alignment mark has a mark pitch or mark periodicity P which equals a width W1 of one trench A and a width W2 of one line B.

During an alignment procedure, a substantially monochromatic radiation beam with a wavelength $\lambda$ is provided for impingement on the grating and generates a diffraction pattern. The radiation beam is generated by any suitable light source, such as a laser device. The diffraction pattern is detected by a sensor (sensor device) and from the measured pattern information on position and orientation of the grating G can be obtained. In the prior art, the pitch P is selected to be larger than the wavelength $\lambda$ of the impinging radiation beam.

The ratio of the width W1 of the trench A and the width W2 of the line B which is also referred to as the duty cycle of the alignment mark, has an effect on signal strength, i.e., the intensity of the diffracted light as measured or received by the sensor.

FIG. 3 depicts in a cross-section a portion of a sub-segmented alignment mark AM in accordance with an embodiment of the present invention.

The sub-segmented alignment mark AM is arranged on substrate 100, and comprises along the horizontal direction D1 a plurality of first elements A and second elements B, that are arranged in an alternating repetitive sequence in the horizontal direction D1 in which each two adjacent first elements A are separated from each other by one intermediate second element B.

Each first element A has a first dimension W1 in the horizontal direction D1, and each second element B has a second dimension W2 in the horizontal direction D1. In this manner a periodic grating structure is formed in the horizontal direction D1, which has a mark pitch P equal to the sum of the first dimension W1 and the second dimension W2. As described above with reference to FIG. 2, the mark pitch P is larger than the wavelength λ of the radiation beam as used during the alignment procedure:

$$P > \lambda \quad [1]$$

Each first element A comprises a first periodic sub-structure and each second element B comprises a second periodic sub-structure, respectively, in the horizontal direction D1 so as to form sub-segmentation in each respective element A, B.

The first periodic sub-structure of the first element A comprises a plurality of first sub-lines L1 with a first sub-line width SLW1 and first sub-spaces S1 with a first sub-space width SSW1. The first sub-lines L1 are parallel to each other in the direction orthogonal to both the horizontal direction D1 and the vertical direction Z, and are separated from each other by one intermediate first sub-space S1 so as to form the first periodic sub-structure with a first sub-pitch P1 equal to the sum of the first sub-line width SLW1 and the first sub-space width SSW1:

$$P1 = SLW1 + SSW1 \quad [2]$$

Likewise, the second sub-structure of the second element B comprises a plurality of second sub-lines L2 with a second sub-line width SLW2 and second sub-spaces S2 with a second sub-space width SSW2. The second sub-lines L2 are parallel to each other in the direction orthogonal to both the horizontal direction D1 and the vertical direction Z, and are separated from each other by one intermediate second sub-space S2 so as to form the second periodic sub-structure with a second sub-pitch P2 equal to the sum of the second sub-line width SLW2 and the second sub-space width SSW2:

$$P2 = SLW2 + SSW2 \quad [3]$$

Both the first and the second sub-pitch P1, P2 are designed smaller than the wavelength λ of the radiation beam as used during the alignment procedure:

$$P1 < \lambda \quad [4]$$

$$P2 < \lambda \quad [5]$$

When P1<λ and P2<λ, by changing the duty cycle, the relative contributions of sub-line and sub-trench within the sub-segmented region is changed, which can be regarded as effectively changing an index of refraction (denoted: nr) of the sub-segmented region.

In an embodiment, the first sub-pitch P1 is designed to be substantially unequal to the second sub-pitch P2.

$$P1 \neq P2 \quad [6]$$

As a consequence the (optical) properties of the first element A are therefore different from the (optical) properties of the second element B, which results in a grating AM having a periodic structure with mark pitch P.

In yet another embodiment, the first sub-pitch P1 is designed to be substantially equal to the second sub-pitch P2.

$$P1 = P2 \quad [7]$$

Under this condition [7], the dimension SLW1 of the first sub-lines L1 in the first element A is designed to be unequal to the dimension SLW2 of the second sub-lines L2:

$$SLW1 \neq SLW2 \quad [8]$$

As mentioned above, the ratio of the line width and the space width in a periodic element has effect on the refractive index of that periodic element. In case the ratio of the first sub-line width SLW1 and the first sub-space width SSW1 in the first element A (first periodic sub-structure) differs from the ratio of the second sub-line width SLW2 and the second sub-space width SSW2 in the second element B (second periodic sub-structure), an effective refractive index NR1 of the first element A will differ from an effective refractive index NR2 of the second element B which causes that the sub-segmented alignment mark AM has a periodic structure with mark pitch P.

It is noted that the construction of each of the first and second periodic sub-structures is described above by way of sub-wavelength lines (sub-lines) and sub-wavelength spaces (sub-spaces). The skilled person will appreciate that in a broader sense each periodic sub-structure (i.e., element A or element B) may also be formed from a periodic arrangement of a first material and a second material instead of actual lines and spaces (void of material). In such a periodic arrangement, the optical properties of the first material for interaction with the radiation beam used for alignment are chosen different from the optical properties of the second material for interaction with the radiation beam. In this respect, within the scope of this application, the term 'sub-wavelength line' or 'sub-line' may be construed as a sub-wavelength line of a first material and the term 'sub-wavelength space' or 'sub-space' may be construed as an other sub-wavelength line of a second material, different from the first material. The mark can thus be constituted from a first and a second material (which may be a sub-line and a sub-space respectively) having for example different refractive indices.

In FIG. 3, the first sub-pitch direction, i.e., the direction of the first sub-pitch P1 is parallel to the direction of the mark pitch P (or overall pitch) of the alignment mark AM. Likewise the second sub-pitch direction (the direction of the second sub-pitch P2) is parallel to the mark pitch direction. It is noted that the first sub-pitch P1 may have a first sub-pitch direction perpendicular to the direction of the overall pitch P. Also, the second sub-pitch P2 may have a first sub-pitch direction perpendicular to the direction of the overall pitch P.

Figure 4:
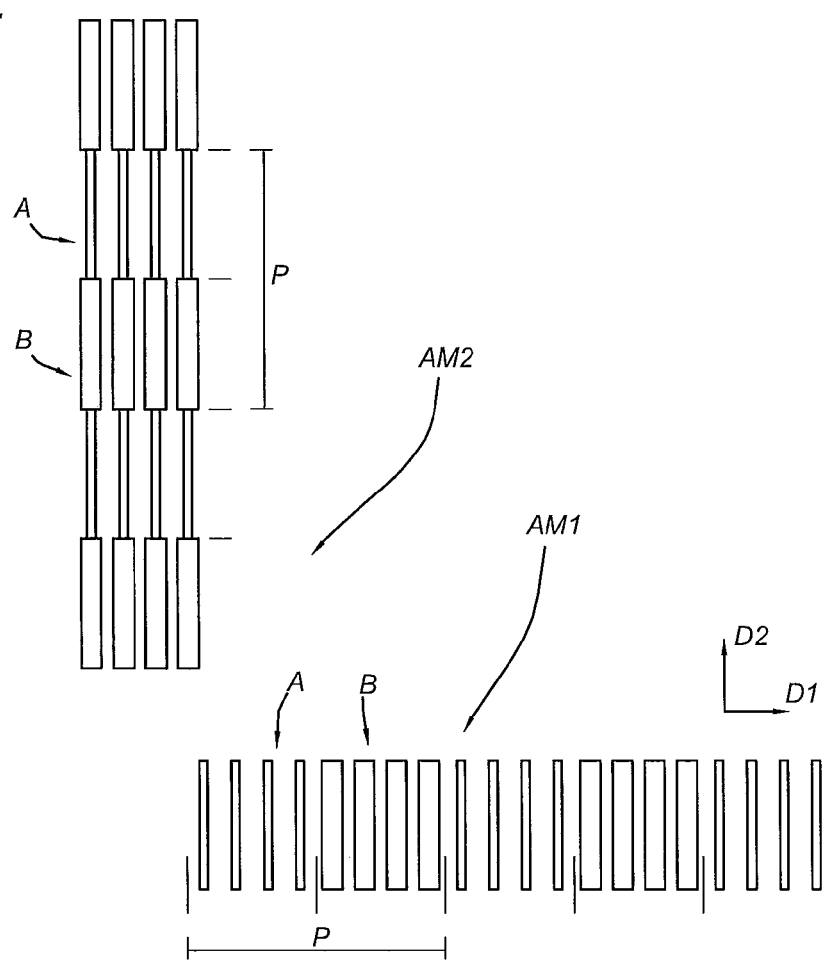
FIG. 4 depicts an arrangement of a pair of sub-segmented alignment marks in accordance with an embodiment of the present invention.

FIG. 4 depicts a top view of an arrangement of a pair of sub-segmented alignment marks in accordance with an embodiment of the present invention.

An arrangement of alignment marks comprises a first alignment mark AM1 and a second alignment mark AM2. The first alignment mark AM1 of the pair alignment marks is directed along the first horizontal direction D1, and the second alignment mark AM2 is directed along the second horizontal direction D2 which is perpendicular to the first horizontal direction.

Each of the first and second alignment marks AM1, AM2 is constructed by a periodic structure of a plurality of first elements A and second elements B, in which the first elements A are separated from each other by one intermediate second element B. Each first element A comprises a first periodic sub-structure and each second element B comprises a second periodic sub-structure.

In the first alignment mark AM1, the periodicity P of the periodic structure is directed in the first horizontal direction D1 with the first and second sub-pitch directions of the first and second sub-pitch P1, P2 of periodic sub-structures of first elements and of second elements B being directed parallel to the first horizontal direction D1, i.e., in substantially the same direction as the periodicity of the first alignment mark.

In the second alignment mark AM2, the periodicity P of the periodic structure is directed in the second horizontal direction D2 while the first and second sub-pitch directions of the first and second sub-pitch P1, P2 of periodic sub-structures of first elements and of second elements B is directed parallel to the first horizontal direction D1, i.e., in substantially the same direction as the direction of the first and second sub-pitches of the first alignment mark.

In the case of extreme dipolar illumination settings, i.e., an illumination mode making use of two beams converging on the reticle, during lithographic processing the printability of the alignment marks is strongly enhanced by the use of sub-segmentation with a sub-pitch P1, P2 of the sub-segmented first and second elements A and B respectively perpendicular to the plane of incidence containing the two illuminating beams.

Thus, the arrangement of the first and second alignment marks AM1, AM2 is such that in each of the first and second alignment marks the direction of the first and second sub-pitch P1, P2 of the sub-segmented first and second elements A and B, respectively, is selected substantially equal to the direction perpendicular to the plane of incidence containing the two illuminating beams.

Figure 5:
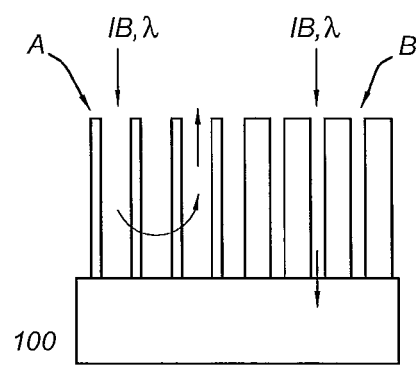
FIG. 5 depicts an illustration of the optical properties of the sub-segmented alignment mark according to an embodiment of the present invention.

FIG. 5 depicts an illustration of the optical properties of the sub-segmented alignment mark according to an embodiment of the present invention.

In FIG. 5, a cross-section of a portion of a proposed alignment mark AM, AM1 in an STI (shallow trench isolation) flow is shown. The alignment mark AM, AM1 comprises a plurality of first elements A with first periodic sub-structure and second sub-segmented elements B with second periodic sub-structure as described above.

To optimize the signal strength of the alignment mark AM, AM1 according to the present invention, one can make use of the resonance effect of the grating modes of the first and/or the second sub-segmented elements A, B, which will be explained here.

Basically, for the resonance effect a distinction is made between a so-called saturation mode and a so-called resonance mode.

In the saturation mode, the periodicity PS of a periodic sub-structure of either the first element A or the second element B is selected to be smaller than the quotient of the wavelength $\lambda$ over the maximum of the refraction coefficient nr of each of the materials (or sub-lines and sub-spaces, as explained above) constituting the grating.

$$\text{Saturation mode: } PS < \lambda/\max(nr) \quad [9]$$

In the resonance mode, the periodicity PS of the periodic sub-structure (A or B) is selected to be between the wavelength $\lambda$ and the quotient of the wavelength $\lambda$ over the maximum of the refraction coefficient nr of each of the materials constituting the grating.

$$\text{Resonance mode: } \lambda/\max(nr) < PS < \lambda \quad [10]$$

In resonance mode, the pitch and the duty cycle of the sub-wavelength grating of the periodic sub-structure (A or B) is chosen such that the condition of eq. [10] where $\lambda/\max(nr) < PS < \lambda$ is fulfilled. This causes a coupling of the incident illumination beam IB, $\lambda$ to the grating modes propagating in the vertical direction Z (i.e., the grating modes relate to two wave vectors $kz = 2\pi \cdot n_{\mathit{eff}}/\lambda$; $n_{\mathit{eff}}$ being the effective refractive index of the respective mode.). The pitch and the duty cycle, in this resonance regime, are chosen such that the incident illumination beam IB, $\lambda$ is coupled to only two of the gratings modes.

The excited modes will propagate down the grating in Z-direction and interfere with each other just as in a normal Mach-Zehnder interferometer.

In order to achieve maximum contrast in the grating G, the duty cycle (SLW/SSW) of the sub-wavelength segmentation in one of the periodic sub-structures (e.g., first periodic sub-structure A) will be chosen such that the two modes will interfere constructively at the substrate side and thus most of the light will be coupled to the substrate and will not be reflected back. Simultaneously, the sub-pitch and the duty cycle of the sub-wavelength grating of the other periodic sub-structure (e.g., second periodic sub-structure B) is chosen such that the condition of eq. [9] where $PS < \lambda/\max(nr)$ is fulfilled. The duty cycle (SLW/SSW) of the sub-wavelength segmentation in the second periodic sub-structure B will be chosen such that the two modes will interfere destructively at the substrate side of the mark. In this way no light or in the worst case very little power will be coupled to the substrate. Most light will be reflected back and coupled to the reflected zero diffraction order of the sub-wavelength segment.

To increase the optical contrast between the first elements A and the second elements B of the alignment mark, in an embodiment, the alignment mark AM, AM1 comprises first elements A and second elements B in which first elements A fulfil one condition selected from the saturation mode condition and the resonance mode condition while the second elements B fulfil the other condition from the saturation mode condition and the resonance mode condition.

In this manner during illumination the alignment mark has relative high optical contrast and can produce a relatively high signal strength of the diffracted light.

Figure 6:
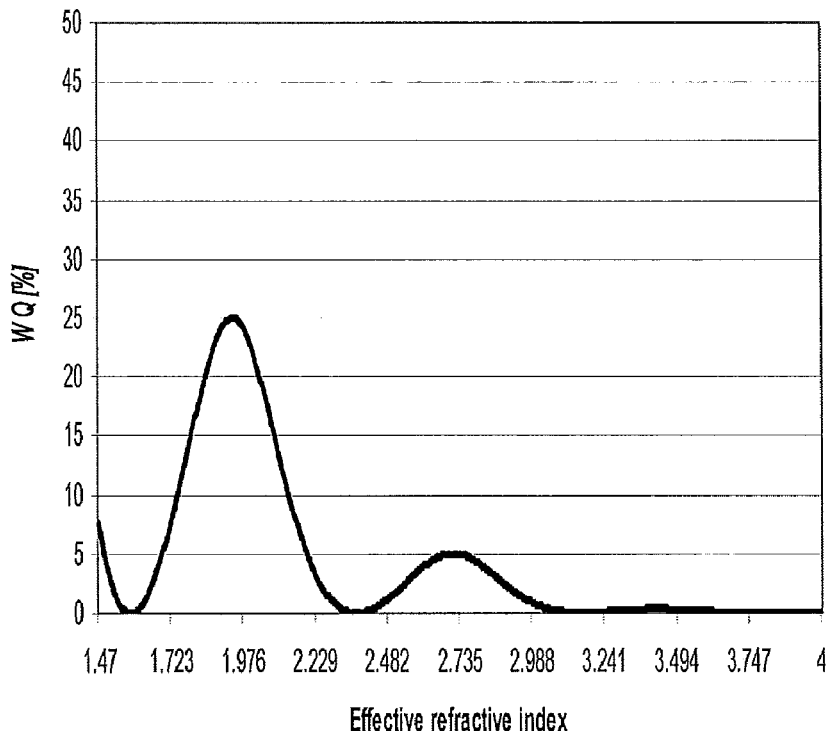
FIG. 6 illustrates the signal strength of first order diffraction beam for an alignment mark in saturation mode design.

FIG. 6 illustrates the signal strength WQ as a function of the effective refractive index for a periodic sub-structure in saturation mode design. The signal strength WQ is shown as a function of effective index change that can be obtained by applying segmentation under the saturation mode condition.

Figure 7:
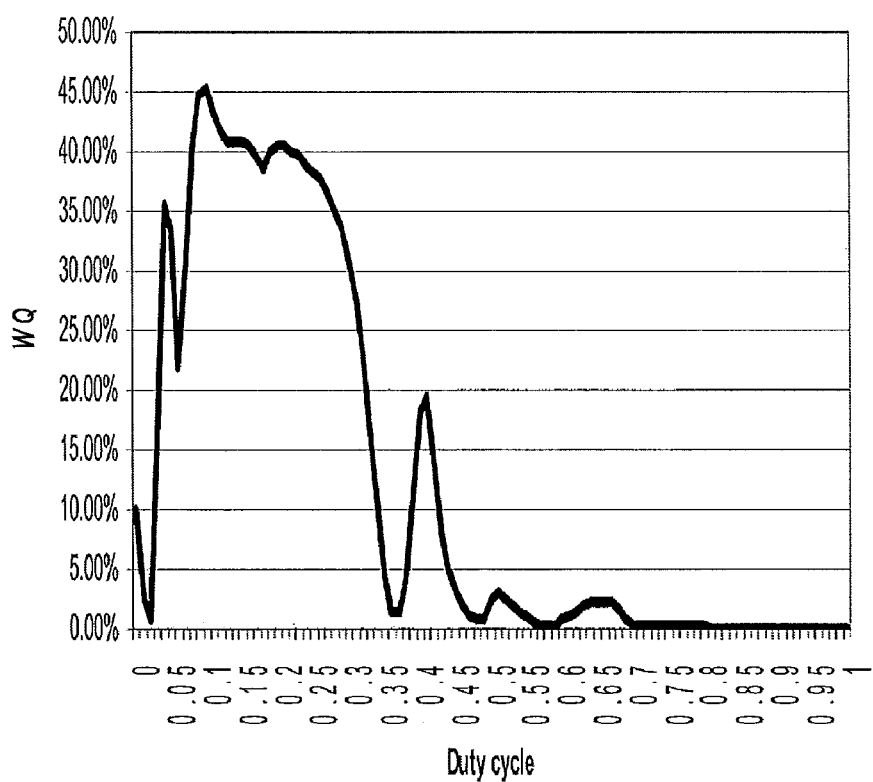
FIG. 7 illustrates the signal strength of first order diffraction beam as a function of duty cycle in the resonance mode design.

FIG. 7 illustrates the signal strength WQ as a function of duty cycle for a periodic sub-structure in the resonance mode design. The signal strength WQ is shown as a function of duty cycle in the resonance mode condition of sub-wavelength pitches, $\lambda/nr \leq pitch \leq \lambda$. From a comparison of FIG. 6 and FIG. 7, it will be appreciated that the latter resonance mode design can give much signal improvement compared to the former saturation mode design.

As described above, a mark can be advantageously provided that is compatible with extreme dipolar illumination setting and also with less extreme method as the pitch P and the first and second elements A, B of the alignment mark AM, AM1 are large, e.g., in the order of the alignment wavelength $\lambda$, or larger.

In addition the signal strength generated by the alignment mark during illumination is enhanced, which will be useful for alignment through opaque hard mask on top of the mark.

It will be appreciated that although the optimization of signal strength may be done for a specific alignment wavelength, such an optimized alignment mark can also be used for another wavelength although the signal strength may not be optimized.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. An alignment mark on a substrate, the alignment mark comprising a periodic structure of a first plurality of first elements and a second plurality of second elements, the first elements and the second elements being arranged in an alternating repetitive sequence in a first direction, an overall pitch of the periodic structure being equal to a sum of a width of the first element and a width of the second element in the first direction;
    each first element comprising a first periodic sub-structure having a first sub-pitch;
    each second element comprising a second periodic sub-structure having a second sub-pitch;
    an optical property of the first element for interaction with a beam of radiation, being different from said optical property of the second element, the beam of radiation having a wavelength; and
    the overall pitch being larger than the wavelength, and each of the first sub-pitch and the second sub-pitch being smaller than the wavelength.

2. An alignment mark according to claim 1, wherein the first periodic sub-structure comprises a plurality of first sub-lines and a plurality of first sub-spaces, the first sub-lines and first sub-spaces being arranged in an alternating repetitive sequence in a first sub-pitch direction, the first sub-pitch of the first periodic sub-structure being equal to a sum of a width of the first sub-line and a width of the first sub-space in the first sub-pitch direction, the first sub-lines extending along the surface of the substrate in a direction substantially perpendicular to the first sub-pitch direction.

3. An alignment mark according to claim 1, wherein the second sub-structure comprises a plurality of second sub-lines and a plurality of second sub-spaces, the second sub-lines and second sub-spaces being arranged in an alternating repetitive sequence in a second sub-pitch direction, the second sub-pitch of the second periodic sub-structure being equal to a sum of a width of the second sub-line and a width of the second sub-space in the second sub-pitch direction, the second sub-lines extending along the surface of the substrate in a direction substantially perpendicular to the second sub-pitch direction.

4. An alignment mark according to claim 2, wherein the first sub-pitch direction is parallel to the first direction.

5. An alignment mark according to claim 2, wherein the second sub-pitch direction is parallel to the first direction.

6. An alignment mark according to claim 3, wherein the first sub-pitch direction is parallel to the second direction.

7. An alignment mark according to claim 3, wherein the second sub-pitch direction is parallel to the second direction.

8. An alignment mark according to claim 1, wherein a duty cycle of the first periodic sub-structure, being the ratio of the width of the first sub-line and the width of the first sub-space, is selected to generate an effective refractive index of the first element and to fulfill a saturation mode condition for the wavelength of the beam of radiation, the first sub-pitch being smaller than the ratio of the wavelength and the maximum of the refractive index of each of the materials constituting the mark.

9. An alignment mark according to claim 1, wherein a duty cycle of the first periodic sub-structure, being the ratio of the width of the first sub-line and the width of the first sub-space, is selected to generate an effective refractive index of the first element and to fulfill a resonance mode condition for the wavelength of the beam of radiation, the first sub-pitch being larger than the ratio of the wavelength and the maximum of the refractive index of each of the materials constituting the grating and being smaller than the wavelength.

10. An alignment mark according to claim 1, wherein a duty cycle of the second periodic sub-structure, being the ratio of the width of the second sub-line and the width of the second sub-space, is selected to generate an effective refractive index of the second element and to fulfill a saturation mode condition for the wavelength of the beam of radiation, the second sub-pitch being smaller than the ratio of the wavelength and the maximum of the refractive index of each of the materials constituting the mark.

11. An alignment mark according to claim 1, wherein a duty cycle of the second periodic sub-structure, being the ratio of the width of the second sub-line and the width of the second sub-space, is selected to generate an effective refractive index of the second element and to fulfill a resonance mode condition for the wavelength of the beam of radiation, the second sub-pitch being larger than the ratio of the wavelength and the maximum of the refractive index of each of the materials constituting the mark and being smaller than the wavelength.

12. An alignment mark according to claim 6, wherein the materials constituting the mark comprise a first material with a first optical property value of an optical property and a second material with a second optical property value of said optical property, the first optical property value being different from the second optical property value.

13. A lithographic apparatus comprising:
an illumination system configured to condition at least one radiation beam;
a support constructed to support a patterning device, the patterning device being capable of imparting the at least one radiation beam with a pattern in its cross-section to form at least one patterned radiation beam;
a substrate table constructed to hold a substrate; and
a projection system configured to project the at least one patterned radiation beam onto a target portion of the substrate,
wherein the substrate comprises an alignment mark having a periodic structure of a first plurality of first elements and a second plurality of second elements, the first elements and the second elements being arranged in an alternating repetitive sequence in a first direction, an overall pitch of the periodic structure being equal to a sum of a width of the first element and a width of the second element in the first direction;
each first element comprising a first periodic sub-structure having a first sub-pitch;
each second element comprising a second periodic sub-structure having a second sub-pitch;
an optical property of the first element for interaction with a beam of radiation, being different from said optical property of the second element, the beam of radiation having a wavelength;
the overall pitch being larger than the wavelength, and each of the first sub-pitch and the second sub-pitch being smaller than the wavelength.

14. A lithographic apparatus according to claim 13, wherein the illumination system is configured with an extreme dipolar illumination setting, arranged to condition two radiation beams to converge on the patterning device, the first sub-pitch of the first element and the second sub-pitch of the second element being directed in a direction perpendicular to a plane of incidence comprising the two radiation beams of the dipolar illumination.

15. A lithographic apparatus according to claim 13, wherein:
the first sub-pitch of the first element is chosen to be in the resonance regime, and a duty cycle of the first element is chosen such that, during illumination by an alignment beam, effective refractive indices of the two grating modes of the first element excited by the alignment beam have constructive interference at a bottom of the alignment mark and create maximum coupling of the light diffracted by the first element to a diffracted beam of zero transmission diffraction order, and
the second sub-pitch of the second element is chosen to be in the resonance regime, and a duty cycle of the second element is chosen such that, during illumination by the alignment beam, effective refractive indices of the two grating modes of the second element excited by the alignment beam have destructive interference at the bottom of the alignment mark and create maximum coupling of the light diffracted by the second element to a diffracted beam of zero reflected diffraction order.

16. A substrate having an alignment mark thereon for use with an alignment beam having a wavelength:
the alignment mark comprising a periodic structure of a plurality of first elements and a plurality of second elements;
the first elements and the second elements being arranged in an alternating repetitive sequence in a first direction;
an overall pitch of the periodic structure being equal to a sum of a width of each first element and a width of each second element in the first direction and being larger than the wavelength; each first element comprising a first periodic sub-structure having a first sub-pitch smaller than the wavelength; each second element comprising a second periodic sub-structure having a second sub-pitch smaller than the wavelength; and an optical property of the first element with respect to the alignment beam being different from said optical property of the second element with respect to the alignment beam.

* * * * *